(12) United States Patent
Kim

(10) Patent No.: US 11,397,200 B2
(45) Date of Patent: Jul. 26, 2022

(54) CURRENT MEASURING APPARATUS AND METHOD

(71) Applicant: LG Chem, Ltd., Seoul (KR)

(72) Inventor: Dong-Hyeon Kim, Daejeon (KR)

(73) Assignee: LG Energy Solution, Ltd.

( * ) Notice: Subject to any disclaimer, the term of this patent is extended or adjusted under 35 U.S.C. 154(b) by 380 days.

(21) Appl. No.: 16/636,817

(22) PCT Filed: Dec. 11, 2018

(86) PCT No.: PCT/KR2018/015728
§ 371 (c)(1),
(2) Date: Feb. 5, 2020

(87) PCT Pub. No.: WO2019/117608
PCT Pub. Date: Jun. 20, 2019

(65) Prior Publication Data
US 2020/0371138 A1 Nov. 26, 2020

(30) Foreign Application Priority Data
Dec. 14, 2017 (KR) .................. 10-2017-0172492

(51) Int. Cl.
*G01R 19/165* (2006.01)
*G01R 31/385* (2019.01)
*H02J 7/00* (2006.01)

(52) U.S. Cl.
CPC ..... *G01R 19/16504* (2013.01); *G01R 31/385* (2019.01); *H02J 7/00304* (2020.01)

(58) Field of Classification Search
CPC ............ G01R 19/16504; G01R 31/385; G01R 19/16542; G01R 31/382; G01R 19/16571; H02J 7/00304; Y02E 60/10; H01M 10/42; H01M 10/48; H01M 10/425; H01M 2010/4271
USPC ...................................... 324/76.11
See application file for complete search history.

(56) References Cited

U.S. PATENT DOCUMENTS

| | | | | |
|---|---|---|---|---|
| 6,150,797 A | * | 11/2000 | Mukainakano | ....... H02J 7/0031 320/136 |
| 7,812,570 B2 | * | 10/2010 | Matsumoto | ........ G01R 31/3648 320/134 |
| 8,173,287 B2 | * | 5/2012 | Sim | ........................ G01R 1/203 324/130 |

(Continued)

FOREIGN PATENT DOCUMENTS

| JP | 2000155139 A | 6/2000 |
|---|---|---|
| JP | 2000277071 A | 10/2000 |

(Continued)

OTHER PUBLICATIONS

Search report from Interntional Application No. PCT/KR2018/015728, dated Mar. 21, 2019.

*Primary Examiner* — M Baye Diao
(74) *Attorney, Agent, or Firm* — Lerner, David, Littenberg, Krumholz & Mentlik, LLP

(57) ABSTRACT

A technique of reducing errors in measurement of a charging/discharging current in a battery module including a plurality of secondary batteries. A current measuring apparatus according to the present disclosure is included in a battery pack including a bus bar on a charging/discharging path to measure a current flowing through the charging/discharging path.

10 Claims, 3 Drawing Sheets

(56) References Cited

U.S. PATENT DOCUMENTS

| | | | |
|---|---|---|---|
| 8,633,826 B2 * | 1/2014 | Kim | ............... H02J 7/0021 340/657 |
| 9,134,775 B2 | 9/2015 | Ye et al. | |
| 9,160,037 B2 * | 10/2015 | Park | ............... B60L 50/52 |
| 2012/0326724 A1 * | 12/2012 | Park | ............... H01M 10/48 324/426 |
| 2015/0229144 A1 | 8/2015 | Jang et al. | |

FOREIGN PATENT DOCUMENTS

| | | | | |
|---|---|---|---|---|
| JP | 2009044824 A | 2/2009 | | |
| JP | 2009145195 A | 7/2009 | | |
| JP | 2010187511 A | 8/2010 | | |
| JP | 4658874 B2 | 3/2011 | | |
| JP | 2015081845 A | 4/2015 | | |
| JP | 2016003916 A | 1/2016 | | |
| KR | 101058682 B1 * | 8/2011 | ......... G01R 31/3835 |
| KR | 20110105536 A | 9/2011 | | |
| KR | 101187288 B1 | 11/2012 | | |
| KR | 20150094167 A | 8/2015 | | |
| KR | 20150120037 A | 10/2015 | | |
| KR | 20170114576 A | 10/2017 | | |
| KR | 102320116 B1 * | 11/2021 | ............ H01M 50/20 |
| WO | WO-02097940 A2 * | 12/2002 | ............ H02H 3/087 |

\* cited by examiner

CURRENT MEASURING APPARATUS AND METHOD

CROSS-REFERENCE TO RELATED APPLICATIONS

The present application is a national phase entry under 35 U.S.C. § 371 of International Application No. PCT/KR2018/015728, filed on Dec. 11, 2018 claims priority from Korean Patent Application No. 10-2017-0172492 filed on Dec. 14, 2017 in the Republic of Korea, the disclosures of which are incorporated herein by reference.

TECHNICAL FIELD

The present disclosure relates to a current measuring apparatus and method, more particularly, to a technique of reducing an error in the measurement of a current when measuring a current flowing through a charging/discharging path included in a battery pack.

BACKGROUND ART

Recently, demands for portable electronic products, such as laptop computers, video cameras, portable phones, etc. have rapidly increased, and development of batteries for energy storage, robots, and satellites, etc. has increased, and thus studies on high-performance secondary batteries capable of repetitive charging and discharging are actively conducted.

Currently commercialized secondary batteries include nickel cadmium batteries, nickel hydrogen batteries, nickel zinc batteries, lithium secondary batteries, etc., and thereamong, the lithium secondary batteries are in the limelight because the lithium secondary batteries have almost no memory effect compared to nickel-based secondary batteries and are thus freely charged and discharged, has a very low self-discharge rate, and has high energy density.

A battery pack is used in various fields, and battery packs having a large capacity are often required for electricity-driven vehicles or smart grid systems. To increase a battery pack capacity, the capacity of a secondary battery, that is, a battery cell, itself may be increased, which, however, shows no remarkable increase in the capacity and has physical limitations in expanding the size of a secondary battery. Thus, a battery pack in which multiple battery modules are connected in series and in parallel is widely used in general.

The battery pack as described above frequently includes a battery management system (BMS) that manages a battery module. Moreover, a BMS monitors a battery module's temperature, voltage, and current, or the like, and controls a balancing operation, a cooling operation, a charging operation, a discharging operation, or the like of a battery pack based on the monitored state of the battery module. For example, a BMS measures a current flowing through a charging/discharging path included in a battery pack, and diagnoses an overcurrent or estimates a state of charge (SOC) and a state of health (SOH) of each secondary battery based on a measured current value.

According to the technique of current measurement of the related art, for the convenience of measurement, an OP-AMP for diagnosing an overcurrent measures a current based on a BMS reference ground as a reference electric potential for the OP-AMP, and a measuring unit for measuring a current measures a current based on one end of a sensing resistor as a reference electric potential for the measuring unit.

According to the current measuring apparatus of the related art, however, due to a resistance component of a bus bar which is an instrumental structure that connects a negative electrode terminal of a battery module to a sensing resistor, an electric potential difference occurs between a BMS reference ground and the one end of the sensing resistor while a charging/discharging current flows. That is, the reference electric potential for current measurement changes due to a voltage applied to the bus bar positioned between the BMS reference ground and the one end of the sensing resistor, thus causing an error in the measurement of a current.

SUMMARY

Technical Problem

The present disclosure is designed to solve the problems of the related art, and therefore the present disclosure is directed to providing a current measuring apparatus and method, in which errors in measurement of a current when measuring a current flowing through a charging/discharging path included in a battery pack are reduced to increase reliability of the measurement of a current.

These and other objects and advantages of the present disclosure may be understood from the following detailed description and will become more fully apparent from the exemplary embodiments of the present disclosure. Also, it will be easily understood that the objects and advantages of the present disclosure may be realized by the means shown in the appended claims and combinations thereof.

Technical Solution

Various embodiments of the present disclosure for achieving the above objects are as follows.

In one aspect of the present disclosure, there is provided an apparatus for measuring a current flowing through a charging/discharging path, the apparatus being provided in a battery pack including a bus bar on the charging/discharging path and the apparatus including: a first current sensing circuit including a sensing resistor electrically connected to a first end of the bus bar and configured to measure a voltage value between a first end and a second end of the sensing resistor and configured to measure a voltage value across the sensing resistor; a second current sensing circuit including an operational amplifier (OP-AMP) that includes a first input terminal, a second input terminal, and an output terminal, wherein the first input terminal is electrically connected to the first end of the sensing resistor, and the second input terminal is electrically connected to the second end of the sensing resistor, the second current sensing circuit being configured to output an overcurrent diagnosis voltage through the output terminal by comparing a voltage applied to the first input terminal with a voltage applied to the second input terminal; and a processor connected to the output terminal of the OP-AMP and configured to calculate a magnitude of the current flowing through the charging/discharging path based on the voltage value measured by the first current sensing circuit, and diagnose an overcurrent based on the overcurrent diagnosis voltage.

Also, the first end of the sensing resistor of the first current sensing circuit may be electrically connected to the first end of the bus bar.

Also, the second current sensing circuit may include a contact point between the first input terminal and the first end of the sensing resistor, and a first dividing resistor between the contact point and the first end of the sensing resistor.

Also, the second current sensing circuit may further include a voltage supply circuit electrically connected to the first input terminal and configured to supply a reference voltage.

Also, the second current sensing circuit may include a second dividing resistor between a first end of the voltage supply circuit and the contact point.

Also, the second current sensing circuit may be configured to divide the reference voltage via the first dividing resistor and the second dividing resistor by using an electric potential of the first end of the sensing resistor as a reference electric potential, and apply the divided reference voltage to the first input terminal via the contact point.

Also, the first input terminal may be an inverting input terminal of the OP-AMP, and the second input terminal is a non-inverting input terminal of the OP-AMP. The processor may detect occurrence of an overcurrent flow through the charging/discharging path based on the overcurrent diagnosis voltage dropping below a preset value.

Also, the first input terminal may be a non-inverting input terminal of the OP-AMP, and the second input terminal may be an inverting input terminal of the OP-AMP. The control unit may detect occurrence of an overcurrent flow through the charging/discharging path based the overcurrent diagnosis voltage increasing to a preset value or higher.

Also, in another aspect of the present disclosure, there is also provided a battery management system (BMS) including the current measuring apparatus according to any of the embodiments of the present disclosure.

Also, in another aspect of the present disclosure, there is also provided a method of measuring a current flowing through a charging/discharging path in a battery pack including a bus bar on the charging/discharging path, the method including: measuring a voltage value between a first end and a second end of the sensing resistor, wherein the the first end of the sensing resistor is electrically connected to a first end of the bus bar; outputting an overcurrent diagnosis voltage through a output terminal of an OP-AMP by comparing a voltage applied to a first input terminal of the OP-AMP electrically connected to the first end of the sensing resistor with a voltage applied to a second input terminal of the OP-AMP electrically connected to the second end of the sensing resistor; and calculating a magnitude of the current flowing through the charging/discharging path, based on the voltage value measured between the first end and the second end of the sensing resistor, and diagnosing an overcurrent state based on the overcurrent diagnosis voltage.

Advantageous Effects

According to the present disclosure, a ground of current measurement in which a sensing resistor is used and a ground of current measurement in which an OP-AMP is used are electrically connected. Also, a reference electric potential of current measurement using a sensing resistor and a reference electric potential of current measurement using an OP-AMP become electrically equal electric potentials. Thus, the reliability of current measurement in a current measurement process can be increased.

Effects of the present disclosure are not limited by the effects described above, and other effects that are not mentioned will become apparent to one of ordinary skill in the art from the appended claims.

DESCRIPTION OF DRAWINGS

The accompanying drawings illustrate a preferred embodiment of the present disclosure and together with the foregoing disclosure, serve to provide further understanding of the technical features of the present disclosure, and thus, the present disclosure is not construed as being limited to the drawing.

DETAILED DESCRIPTION

Figure 1:
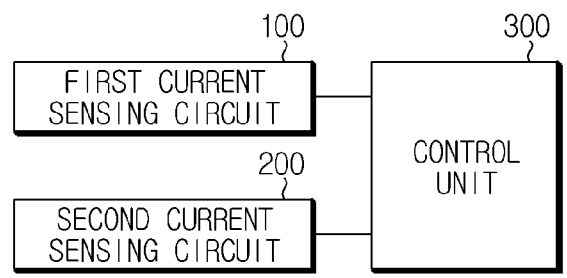
FIG. 1 is a schematic diagram of a functional configuration of a current measuring apparatus, according to an embodiment of the present disclosure.

Hereinafter, preferred embodiments of the present disclosure will be described in detail with reference to the accompanying drawings. Prior to the description, it should be understood that the terms used in the specification and the appended claims should not be construed as limited to general and dictionary meanings, but interpreted based on the meanings and concepts corresponding to technical aspects of the present disclosure on the basis of the principle that the inventor is allowed to define terms appropriately for the best explanation.

Therefore, the description proposed herein is just a preferable example for the purpose of illustrations only, not intended to limit the scope of the disclosure, so it should be understood that other equivalents and modifications could be made thereto without departing from the scope of the disclosure.

Also, in the description of the present disclosure, certain detailed explanations of related art or functions are omitted when it is deemed that they may unnecessarily obscure the essence of the disclosure.

Throughout the specification, when a portion "includes" a component, it is intended to indicate that another component may be further included instead of excluding the other component, unless otherwise indicated. Also, the term such as "control unit" herein denotes a unit of processing at least one function or operation, and may be embodied via hardware, software, or a combination of hardware and software.

In addition, throughout the specification, when a portion is "connected" to another portion, they may be not only "directly connected", but may also be "indirectly connected" with another device therebetween. Also, a secondary battery may refer to one unit cell or a plurality of unit cells connected in parallel.

In the present specification, a secondary battery may include one unit cell or a plurality of unit cells connected in parallel. A unit cell includes a negative electrode terminal and a positive electrode terminal, and refers to one independent, physically separable cell. For example, one pouch-type lithium polymer cell may be regarded as a unit cell.

A current measuring apparatus according to the present disclosure may be provided in a battery pack including a bus bar on a charging/discharging path and measure a current flowing through the charging/discharging path. The battery pack may include a battery module B and a bus bar 10. In particular, the battery module B and the bus bar 10 may be serially connected on a charging/discharging path electrically connecting between a positive electrode terminal of the battery pack and a negative electrode terminal of the battery pack.

The battery module B may include at least one secondary battery. The at least one secondary battery may be electrically connected to each other serially and/or in parallel.

The bus bar 10 may electrically connect between a negative electrode terminal of the battery module B and a negative electrode terminal of the battery pack. The bus bar 10 may have a bus bar resistance that disturbs a current flow. For example, the bus bar 10 may be a metallic conductive plate. In particular, the bus bar 10 may be a metallic conductive plate electrically connecting between a negative electrode terminal of the battery module B and a printed circuit board (PCB) of a battery management system (BMS) or between the negative electrode terminal of the battery module B and a negative electrode terminal of the battery pack.

Preferably, the BMS including the current measuring apparatus according to the present disclosure may use a ground G connected to the negative electrode terminal of the battery module B as an operation reference electric potential for components in the BMS. In particular, the ground G may be electrically connected from a contact point, to which the negative electrode terminal of the battery module B and one end of the bus bar 10 are commonly coupled, into the BMS. For example, the ground G may be connected, via an electric wire, from the contact point where the negative electrode terminal of the battery module B and the one end of the bus bar 10 are commonly connected, to the circuit board of the BMS by soldering.

Figure 2:
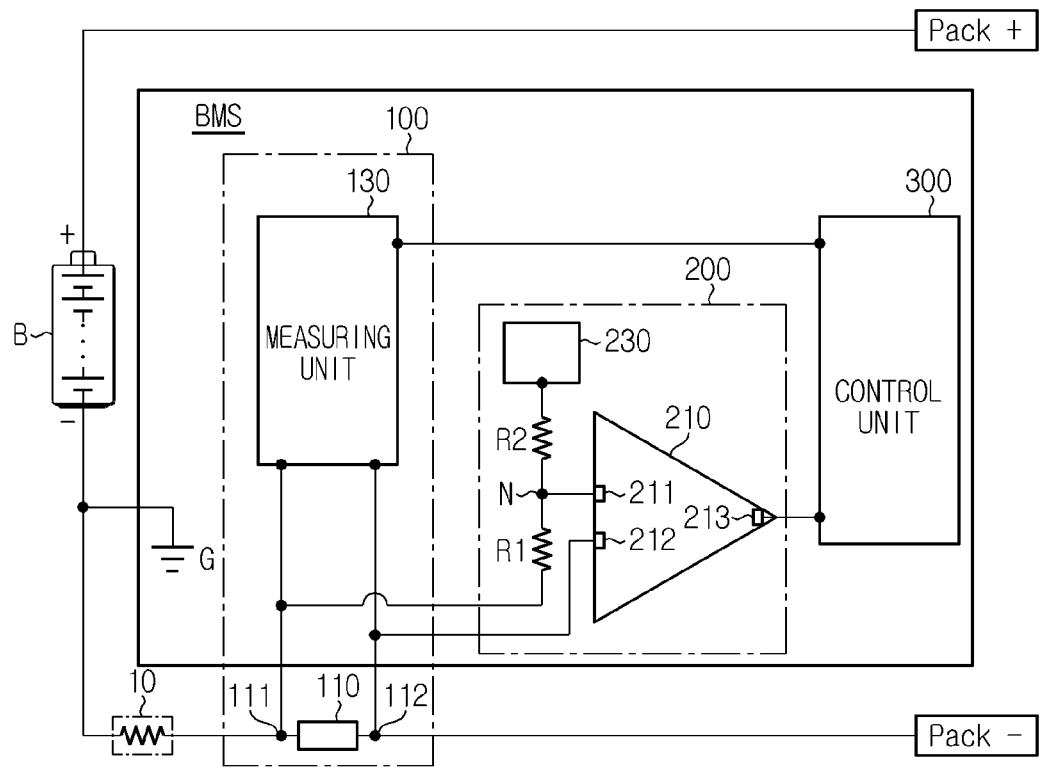
FIG. 2 is a schematic diagram of a circuit configuration in which a current measuring apparatus according to an embodiment of the present disclosure is connected to some components of a battery pack.

FIG. 1 is a schematic diagram of a functional configuration of a current measuring apparatus according to an embodiment of the present disclosure. FIG. 2 is a schematic diagram of a circuit configuration in which a current measuring apparatus according to an embodiment of the present disclosure is connected to some components of a battery pack.

Referring to FIGS. 1 and 2, the current measuring apparatus according to the present disclosure may include a first current sensing circuit 100, a second current sensing circuit 200, and a control unit 300.

The first current sensing circuit 100 may include a sensing resistor 110 and a measuring unit 130. The sensing resistor 110 may be electrically connected to one end of the bus bar 10. For example, as illustrated in the configuration of FIG. 2, one end of the sensing resistor 110 may be directly connected to the one end of the bus bar 10, and the other end of the sensing resistor 110 may be directly connected to a negative electrode terminal of the battery pack. That is, the sensing resistor 110 may be connected serially between the bus bar 10 and the negative electrode terminal of the battery pack.

The measuring unit 130 may be electrically connected to each of a first end 111 and a second end 112 of the sensing resistor 110. That is, the measuring unit 130 may be connected to the both ends of the sensing resistor 110. For example, as illustrated in the configuration of FIG. 2, the measuring unit 130 may be directly connected to each of the first end 111 and the second end 112 of the sensing resistor 110.

In addition, the measuring unit 130 may measure a voltage value across the sensing resistor 110. In particular, the measuring unit 130 may measure the voltage value across the sensing resistor 110 by using voltages measured from the both ends of the sensing resistor 110, that is, measured via the first end 111 and the second end 112.

The second current sensing circuit 200 may include an operational amplifier (OP-AMP) 210. The OP-AMP 210 may include a first input terminal 211, a second input terminal 212, and an output terminal 213.

The first input terminal 211 may be electrically connected to the first end 111 of the sensing resistor 110. In addition, the second input terminal 212 may be electrically connected to the second end 112 of the sensing resistor 110. For example, as illustrated in the configuration of FIG. 2, the first input terminal 211 may be commonly coupled to a connection line between the measuring unit 130 and the first end 111 to be electrically connected to the first end 111 of the sensing resistor 110. In addition, the second input terminal 212 may be commonly coupled to a connection line between the measuring unit 130 and the second end 112 to be electrically connected to the second end 112 of the sensing resistor 110.

The output terminal 213 may output an overcurrent diagnosis voltage by comparing a voltage applied to the first input terminal 211 with a voltage applied to the second input terminal 212. In particular, the OP-AMP 210 may output the overcurrent diagnosis voltage through the output terminal 213 based on a voltage difference between the voltages respectively applied to the first input terminal 211 and the second input terminal 212. Here, a reference voltage difference used as a criterion for outputting the overcurrent diagnosis voltage may be preset.

The control unit 300 may receive the voltage value across the sensing resistor 110. In particular, the control unit 300 may receive the voltage value across the sensing resistor 110 from the measuring unit 130. For example, the control unit 300 may receive the voltage value across the sensing resistor 110 periodically in each preset cycle. In addition, the control unit 300 may calculate a magnitude of a current flowing through a charging/discharging path by using the voltage value across the sensing resistor 110. For example, the control unit 300 may calculate the magnitude of the current by applying, to Ohm's law, the voltage value across the sensing resistor 110 and a preset resistance value of the sensing resistor 110. In addition, the control unit 300 may be connected to the output terminal 213 of the OP-AMP 210 and configured to diagnose an overcurrent by using the overcurrent diagnosis voltage. For example, when an absolute value of the overcurrent diagnosis voltage is equal to or higher than a preset value, the control unit 300 may diagnose that an overcurrent is flowing through the sensing resistor 110.

Preferably, the first current sensing circuit 100 may be configured, as illustrated in the configuration of FIG. 2, such that the first end 111 of the sensing resistor 110 is electrically connected to the one end of the bus bar 10. The bus bar 10 may be positioned between a contact point, to which the ground G of the BMS and the negative electrode terminal of the battery module B are commonly coupled, and the first end 111. In particular, the first end 111 may be directly connected to the one end of the bus bar 10.

Also, preferably, the second current sensing circuit 200 may include, as illustrated in the configuration of FIG. 2, a contact point N between the first input terminal 211 and the first end 111 of the sensing resistor 110. The second current sensing circuit 200 may include a first dividing resistor R1 between the contact point N and the first end 111 of the sensing resistor 110. In particular, the second current sensing circuit 200 may include the first dividing resistor R1 between a contact point, to which the measuring unit 130 and the first end 111 are commonly coupled, and the contact point N.

More preferably, the second current sensing circuit 200 may further include, as illustrated in the configuration of FIG. 2, a voltage supply circuit 230 electrically connected to the first input terminal 211 and configured to supply a reference voltage. For example, the voltage supply circuit 230 may be a voltage source supplying the reference voltage of 5 V.

More preferably, the second current sensing circuit 200 may include, as illustrated in the configuration of FIG. 2, a second dividing resistor R2 between one end of the voltage supply circuit 230 and the contact point N.

Preferably, the first dividing resistor R1 and the second dividing resistor R2 may divide a voltage difference between the reference voltage supplied from one end of the voltage supply circuit 230 and the voltage applied to the first end 111, by a resistance ratio between the first dividing resistor R1 and the second dividing resistor R2. That is, the second current sensing circuit 200 may divide the reference voltage by the resistance ratio between the first dividing resistor R1 and the second dividing resistor R2 by using an electric potential applied to the first end 111, as a reference electric potential. The reference voltage divided by the resistance ratio between the first dividing resistor R1 and the second dividing resistor R2 may be applied to the first input terminal 211 via the contact point N.

According to this configuration, in the current measuring apparatus of the present disclosure, a ground is configured such that a reference electric potential of current measurement of the measuring unit 130 and a reference electric potential of overcurrent measurement of the OP-AMP 210 are set at equal electric potentials, thereby reducing an error in measurement of a current.

Meanwhile, the control unit 300 may selectively include an application-specific integrated circuit (ASIC), another chip set, a logic circuit, a register, a communication modem, and/or a data processing apparatus, or the like, known in the art to execute the above-described operation.

Preferably, the control unit 300 may include a memory device. The memory device is not specifically limited to any one type as long as the memory device is a storage medium capable of recording and erasing information. For example, the memory device may be RAM, ROM, a register, a hard disk, an optical recording medium or a magnetic recording medium. The memory device may be electrically connected to the control unit 300 via, for example, a data bus, so as to be accessible by the control unit 300. The memory device may also store and/or update and/or update and/or transmit data generated when programs including various control logics performed by the control unit 300 and/or generated during execution of control logic. The memory device may be logically split into two or more.

Figure 3:
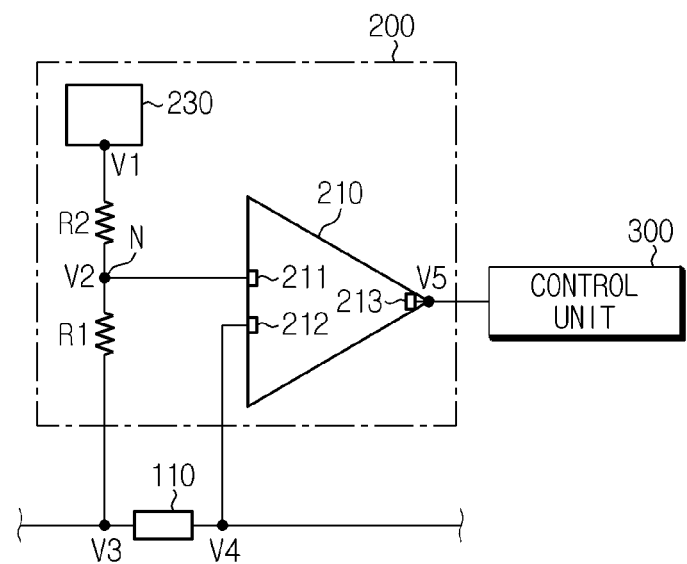
FIG. 3 is a schematic diagram illustrating a connection configuration between a second current sensing circuit and some components of a current measuring apparatus, according to an embodiment of the present disclosure.

FIG. 3 is a schematic diagram illustrating a connection configuration between a second current sensing circuit and some components of a current measuring apparatus, according to an embodiment of the present disclosure.

Referring to FIG. 3, the second current sensing circuit 200 according to the present disclosure may divide the reference voltage via the first dividing resistor R1 and the second dividing resistor R2 by using the electric potential of the first end 111 of the sensing resistor 110 as a reference electric potential. For example, as illustrated in the configuration of FIG. 3, the second current sensing circuit 200 may divide the reference voltage V1 by using the voltage V3 applied to the first end 111 as a reference electric potential. In detail, the second current sensing circuit 200 may be configured such that a voltage difference between the voltage V3 applied to the first end 111 and the reference voltage V1 is divided by the resistance ratio between the first dividing resistor R1 and the second dividing resistor R2, and the divided voltage V2 is applied to the contact point N.

In addition, the second current sensing circuit 200 may be configured to apply a reference voltage divided via the first dividing resistor R1 and the second dividing resistor R2, to the first input terminal 211 via the contact point N. That is, the second current sensing circuit 200 may be configured to apply the divided voltage V2 to the first input terminal 211 via the contact point N.

In addition, the second current sensing circuit 200 may be configured to apply the voltage V4 of the second end 112 of the sensing resistor 110 to the second input terminal 212.

Preferably, the second current sensing circuit 200 may be configured to output the overcurrent diagnosis current V5 through the output terminal 213 when a voltage difference between the voltage V2 applied to the first input terminal 211 and the voltage V4 applied to the second input terminal 212 is equal to or higher than or equal to or lower than the preset value. Here, the control unit 300 may receive the overcurrent diagnosis voltage V5, and diagnose an overcurrent based on the received overcurrent diagnosis voltage V5.

According to this configuration, the current measuring apparatus according to the present disclosure may not use a reference ground of the BMS as a reference electric potential for measurement of an OP-AMP, but set a voltage of one end of a sensing resistor as the reference electric potential for measurement, thereby reducing an error in measurement of a current due to a resistance of a bus bar, or the like, existing on a charging/discharging path.

Figure 4:
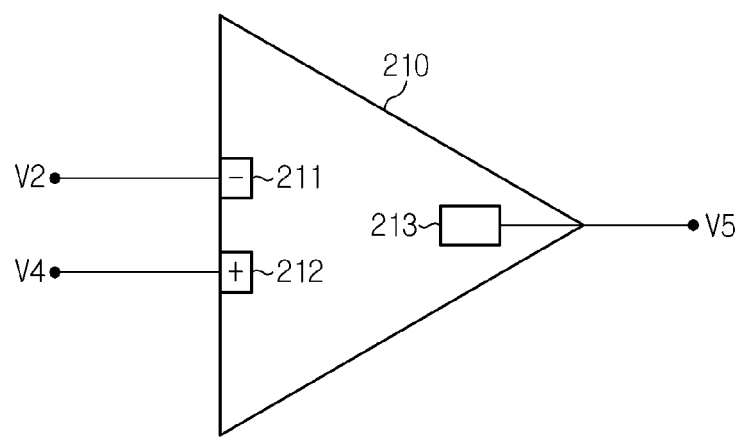
FIG. 4 is a schematic structural diagram of an OP-AMP included in a second current sensing circuit, according to an embodiment of the present disclosure.

FIG. 4 is a schematic structural diagram of an OP-AMP included in a second current sensing circuit according to an embodiment of the present disclosure.

Referring to FIGS. 3 and 4, in the second current sensing circuit 200 according to the present disclosure, the first input terminal 211 may be an inverting input terminal of the OP-AMP 210, and the second input terminal 212 may be a non-inverting input terminal of the OP-AMP 210. Here, the voltage V2 applied to the contact point N is received by the first input terminal 211, and the voltage V4 applied to the second end 112 is received by the second input terminal 212.

According to the configuration as described above, when the overcurrent diagnosis voltage V5 drops below the preset value, the control unit 300 according to the present disclosure may diagnose that an overcurrent state in which an overcurrent flows through the charging/discharging path occurred.

For example, when a charging/discharging current flows in a direction from the first end 111 to the second end 112, the OP-AMP 210 compares the voltage V2 applied to the first input terminal 211 with the voltage V4 applied to the second input terminal 212. Also, when the voltage V4 applied to the first input terminal 211 drops due to an overcurrent, an output of the overcurrent diagnosis voltage V5 output through the output terminal 213 of the OP-AMP 210 decreases. Here, when the overcurrent diagnosis current V5 drops below the preset value, the control unit 300 may diagnose that the overcurrent state in which an overcurrent flows through the charging/discharging path occurred.

Figure 5:
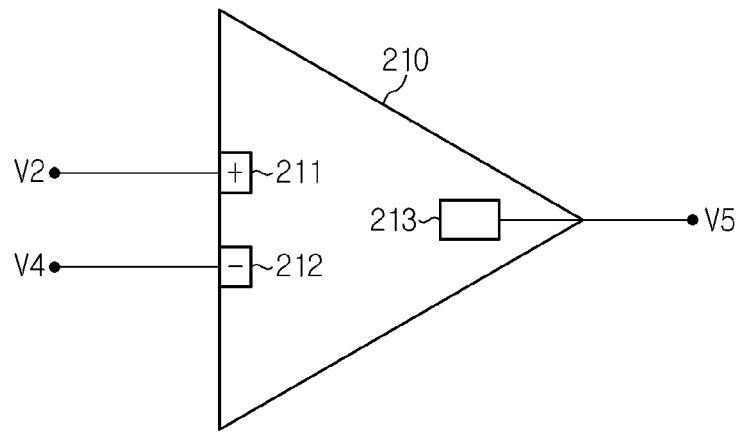
FIG. 5 is a schematic structural diagram of an OP-AMP included in a second current sensing circuit, according to another embodiment of the present disclosure.

FIG. 5 is a schematic structural diagram of an OP-AMP included in a second current sensing circuit, according to another embodiment of the present disclosure.

Referring to FIGS. 3 and 5, in the second current sensing circuit 200 according to the present disclosure, the first input terminal 211 may be a non-inverting input terminal of the OP-AMP 210, and the second input terminal 212 may be a non-inverting input terminal of the OP-AMP 210. Here, the voltage V2 applied to the contact point N is received by the first input terminal 211, and the voltage V4 applied to the second end 112 is received by the second input terminal 212.

According to the configuration as described above, when the overcurrent diagnosis voltage V5 increases to the preset value or higher, the control unit 300 according to the present disclosure may diagnose that an overcurrent state in which an overcurrent flows through the charging/discharging path occurred.

For example, when a charging/discharging current flows in a direction from the first end 111 to the second end 112, the OP-AMP 210 compares the voltage V2 applied to the first input terminal 211 with the voltage V4 applied to the second input terminal 212. Also, an output of the overcurrent diagnosis voltage V5 output through the output terminal 213 of the OP-AMP 210 is increased when the voltage V4 applied to the second end 112 drops due to an overcurrent. Here, when the overcurrent diagnosis current V5 increases to the preset value or higher, the control unit 300 may diagnose that an overcurrent state in which an overcurrent flows through the charging/discharging path occurred.

The current measuring apparatus according to the present disclosure may be applied to the BMS. That is, the BMS according to the present disclosure may include the current measuring apparatus according to the present disclosure described above. In this configuration, at least some of components of the current measuring apparatus according to the present disclosure may be realized by compensating functions of the components included in a BMS according to the related art or by adding function thereto. For example, the measuring unit 130 and the control unit 300 of the current measuring apparatus according to the present disclosure may be implemented as a component of the BMS.

Figure 6:
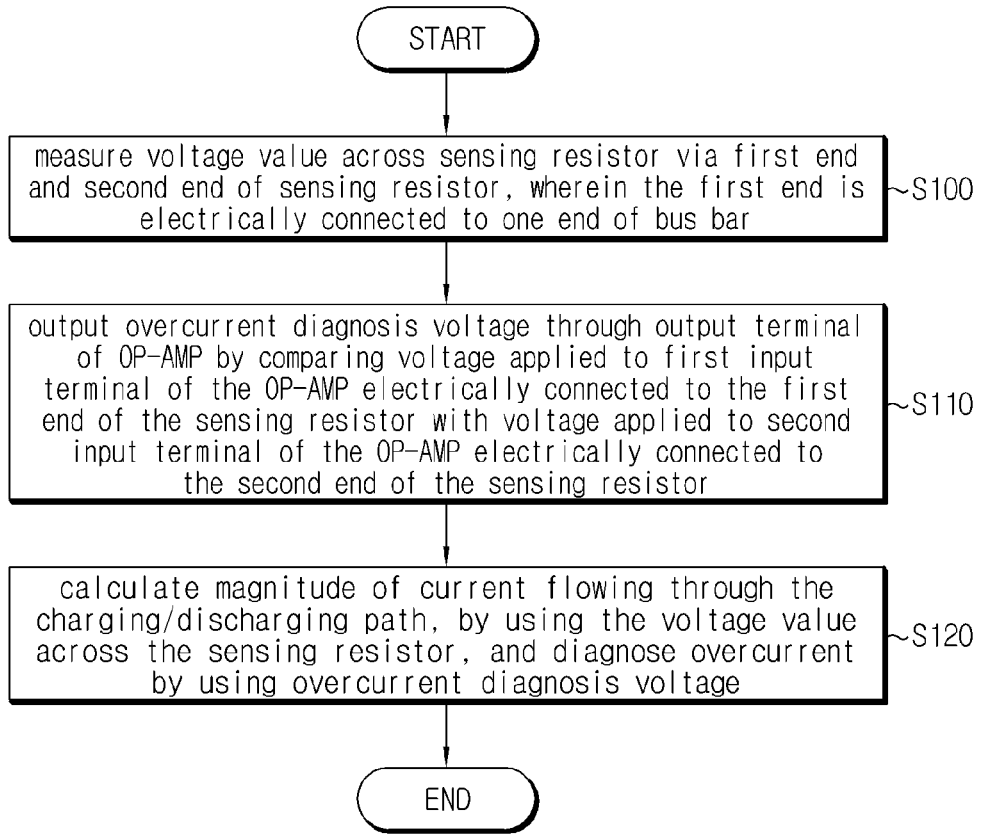
FIG. 6 is a schematic flowchart of a current measuring method according to an embodiment of the present disclosure.

FIG. 6 is a schematic flowchart of a current measuring method according to an embodiment of the present disclosure. In FIG. 6, subjects respectively performing respective operations may be regarded as the components of the current measuring apparatus according to the present disclosure described above.

As illustrated in FIG. 6, in Step S100, the measuring unit 130 measures the voltage value across the sensing resistor 110 via the first end 111 and the second end 112 of the sensing resistor 110. The first end 111 is electrically connected to the one end of the bus bar 10 (S100).

In Step S110, the OP-AMP 210 outputs the overcurrent diagnosis voltage through the output terminal 213 of the OP-AMP 210 by comparing the voltage applied to the first input terminal 211 of the OP-AMP 210 electrically connected to the first end 111 of the sensing resistor 110 with the voltage applied to the second input terminal 212 of the OP-AMP 210 electrically connected to the second end 112 of the sensing resistor 110 (S110).

In Step S120, the control unit 300 calculates a magnitude of a current flowing through the charging/discharging path, by using the voltage value across the sensing resistor 110 measured in the operation of measuring a voltage value across the sensing resistor 110, and diagnoses an overcurrent by using the overcurrent diagnosis voltage output in the operation of outputting an overcurrent diagnosis voltage (S120).

Preferably, in Step S110, in the OP-AMP 210, the reference voltage divided via the first dividing resistor R1 and the second dividing resistor R2 may be applied to the first input terminal 211 by using the voltage of the first end 111 of the sensing resistor 110 as the reference electric potential.

Also, when the control logic is realized by software, the control unit 300 may be realized using a combination of program modules. The program modules may be stored in a memory device and executed by a processor.

At least one of the various control logics of the control unit 300 may be combined, and a type of the combined control logics is not specifically limited as long as they are written as a computer readable code system and accessible by a computer. For example, the recording medium includes at least one selected from the group consisting of ROM, RAM, a register, CD-ROM, a magnetic tape, a hard disk, a floppy disk, and an optical data recording apparatus. In addition, the code system may be distributed and stored in a network-connected computer and executed. In addition, functional programs, codes, and segments for implementing the combined control logics may be easily inferred by programmers skilled in the art to which the present disclosure pertains.

The present disclosure has been described by limited embodiments and drawings, but the present disclosure is not limited thereto, and various changes and modifications are possible within the scope of the disclosure and the equivalent range of appended claims by one of ordinary skill in the art.

In the present specification, terms such as 'measuring unit' and 'control unit' are used, but the terms indicate a logical constituent unit, and it will be obvious to a person skilled in the art that the terms do not indicate a component that is physically separable or must be physically separated.

What is claimed is:

1. An apparatus for measuring a current flowing through a charging/discharging path, the apparatus being provided in a battery pack including a bus bar on the charging/discharging path and the apparatus comprising:
    a first current sensing circuit including a sensing resistor electrically connected to a first end of the bus bar and configured to measure a voltage value between a first end and a second end of the sensing resistor;
    a second current sensing circuit including an operational amplifier (OP-AMP) that includes a first input terminal, a second input terminal, and an output terminal, wherein the first input terminal is electrically connected to the first end of the sensing resistor, and the second input terminal is electrically connected to the second end of the sensing resistor, the second current sensing circuit being configured to output an overcurrent diagnosis voltage through the output terminal by comparing a voltage applied to the first input terminal with a voltage applied to the second input terminal; and
    a processor connected to the output terminal of the OP-AMP and configured to:
    calculate a magnitude of the current flowing through the charging/discharging path based on the voltage value measured by the first current sensing circuit; and diagnose an overcurrent based on the overcurrent diagnosis voltage.

2. The current measuring apparatus of claim 1, wherein the first end of the sensing resistor of the first current sensing circuit is electrically connected to the first end of the bus bar.

3. The current measuring apparatus of claim 1, wherein the second current sensing circuit further includes:
   a contact point between the first input terminal and the first end of the sensing resistor; and
   a first dividing resistor between the contact point and the first end of the sensing resistor.

4. The current measuring apparatus of claim 3, wherein the second current sensing circuit further includes a voltage supply circuit electrically connected to the first input terminal and configured to supply a reference voltage.

5. The current measuring apparatus of claim 4, wherein the second current sensing circuit further includes a second dividing resistor between a first end of the voltage supply circuit and the contact point.

6. The current measuring apparatus of claim 5, wherein the second current sensing circuit is configured to:
   divide the reference voltage via the first dividing resistor and the second dividing resistor by using an electric potential of the first end of the sensing resistor as a reference electric potential, and
   apply the divided reference voltage to the first input terminal via the contact point.

7. The current measuring apparatus of claim 1, wherein the first input terminal is an inverting input terminal of the OP-AMP, and the second input terminal is a non-inverting input terminal of the OP-AMP, and
   the processor is configured to detect occurrence of an overcurrent flow through the charging/discharging path based on the overcurrent diagnosis voltage dropping below a preset value.

8. The current measuring apparatus of claim 1, wherein the first input terminal is a non-inverting input terminal of the OP-AMP, and the second input terminal is an inverting input terminal of the OP-AMP, and
   the processor is configured to detect occurrence of an overcurrent flow through the charging/discharging path based the overcurrent diagnosis voltage increasing to a preset value or higher.

9. A battery management system including the apparatus according to claim 1.

10. A method of measuring a current flowing through a charging/discharging path in a battery pack including a bus bar on the charging/discharging path, the method comprising:
    measuring a voltage value between a first end and a second end of a sensing resistor, wherein the first end of the sensing resistor is electrically connected to a first end of the bus bar;
    outputting an overcurrent diagnosis voltage through an output terminal of an operational amplifier (OP-AMP) by comparing a voltage applied to a first input terminal of the OP-AMP electrically connected to the first end of the sensing resistor with a voltage applied to a second input terminal of the OP-AMP electrically connected to the second end of the sensing resistor;
    calculating a magnitude of the current flowing through the charging/discharging path, based on the voltage value measured between the first end and the second end of the sensing resistor; and
    diagnosing an overcurrent state based on the overcurrent diagnosis voltage.

* * * * *